United States Patent
Li et al.

(10) Patent No.: US 12,506,023 B2
(45) Date of Patent: Dec. 23, 2025

(54) OPENING/CLOSING APPARATUS AND TRANSPORT CHAMBER

(71) Applicant: Tokyo Electron Limited, Tokyo (JP)

(72) Inventors: Dongwei Li, Nirasaki (JP); Takehiro Shindo, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 278 days.

(21) Appl. No.: 17/692,754

(22) Filed: Mar. 11, 2022

(65) Prior Publication Data

US 2022/0301911 A1    Sep. 22, 2022

(30) Foreign Application Priority Data

Mar. 17, 2021   (JP) .................... 2021-043858

(51) Int. Cl.
*H01L 21/677* (2006.01)
*H01L 21/67* (2006.01)

(52) U.S. Cl.
CPC .. *H01L 21/67709* (2013.01); *H01L 21/67167* (2013.01); *H01L 21/67196* (2013.01); *H01L 21/67742* (2013.01); *H01L 21/67745* (2013.01)

(58) Field of Classification Search
CPC ......... H01L 21/67709; H01L 21/67167; H01L 21/67196; H01L 21/67742; H01L 21/67745; H01L 21/67126; H01L 21/67184; H01L 21/67706; F16K 11/22; F16K 31/0675

See application file for complete search history.

(56) References Cited

U.S. PATENT DOCUMENTS

| | | | | |
|---|---|---|---|---|
| 7,988,398 B2* | 8/2011 | Hofmeister | ....... | H01L 21/67727 156/345.31 |
| 2003/0102721 A1* | 6/2003 | Ueta | .................. | G03F 7/70758 310/12.25 |
| 2004/0151562 A1* | 8/2004 | Hofmeister | ....... | H01L 21/67184 414/217 |
| 2015/0214014 A1* | 7/2015 | Sato | ..................... | H01L 21/6719 156/345.54 |
| 2016/0218029 A1* | 7/2016 | Janakiraman | ..... | H01L 21/67709 |
| 2022/0130701 A1* | 4/2022 | Hatano | ............. | H01L 21/67742 |
| 2022/0223447 A1* | 7/2022 | Hatano | ............. | H01L 21/67742 |
| 2022/0415687 A1* | 12/2022 | Hatano | .................. | H02K 41/03 |

FOREIGN PATENT DOCUMENTS

| | | | | |
|---|---|---|---|---|
| JP | 2006-170373 A | 6/2006 | | |
| JP | 4010314 B2 * | 11/2007 | ............... | F16K 1/24 |
| JP | 2018504784 A | 2/2018 | | |
| JP | 2019-523367 A1 | 8/2019 | | |
| WO | 02/05330 A2 | 1/2002 | | |
| WO | WO-2016118335 A1 * | 7/2016 | ....... | H01L 21/67155 |
| WO | WO-2018224150 A1 * | 12/2018 | ............... | F16K 3/18 |

* cited by examiner

*Primary Examiner* — Kaitlin S Joerger
(74) *Attorney, Agent, or Firm* — Nath, Goldberg & Meyer; Jerald L. Meyer; Tanya E. Harkins

(57) ABSTRACT

An opening/closing apparatus for opening/closing an opening which allows a first chamber and a second chamber adjacent to the first chamber to communicate with each other, includes a planar motor including coils arranged in the first chamber, a moving body including a valve body configured to move on the planar motor and close the opening, and a controller configured to control energization of the coils.

9 Claims, 13 Drawing Sheets

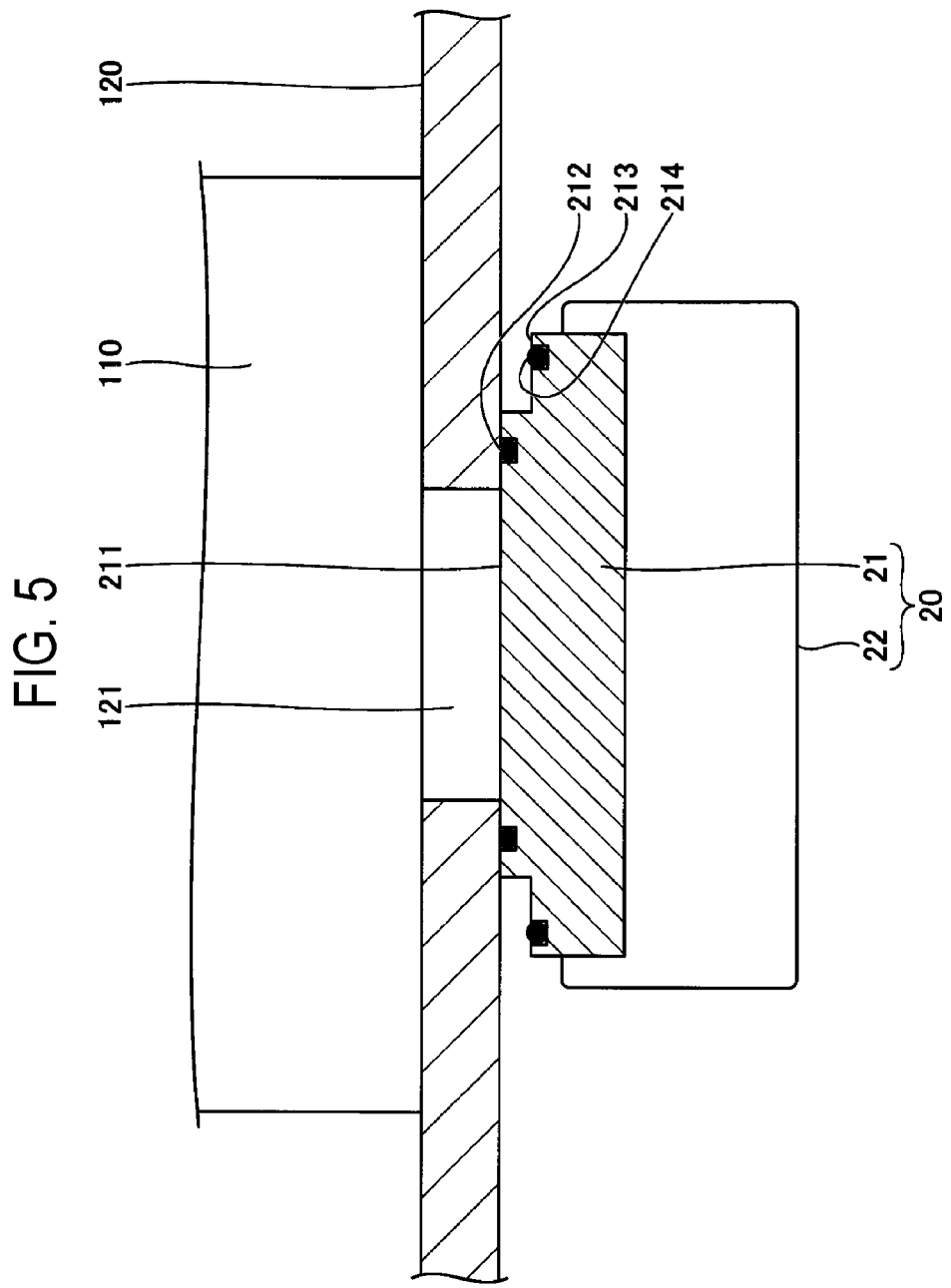

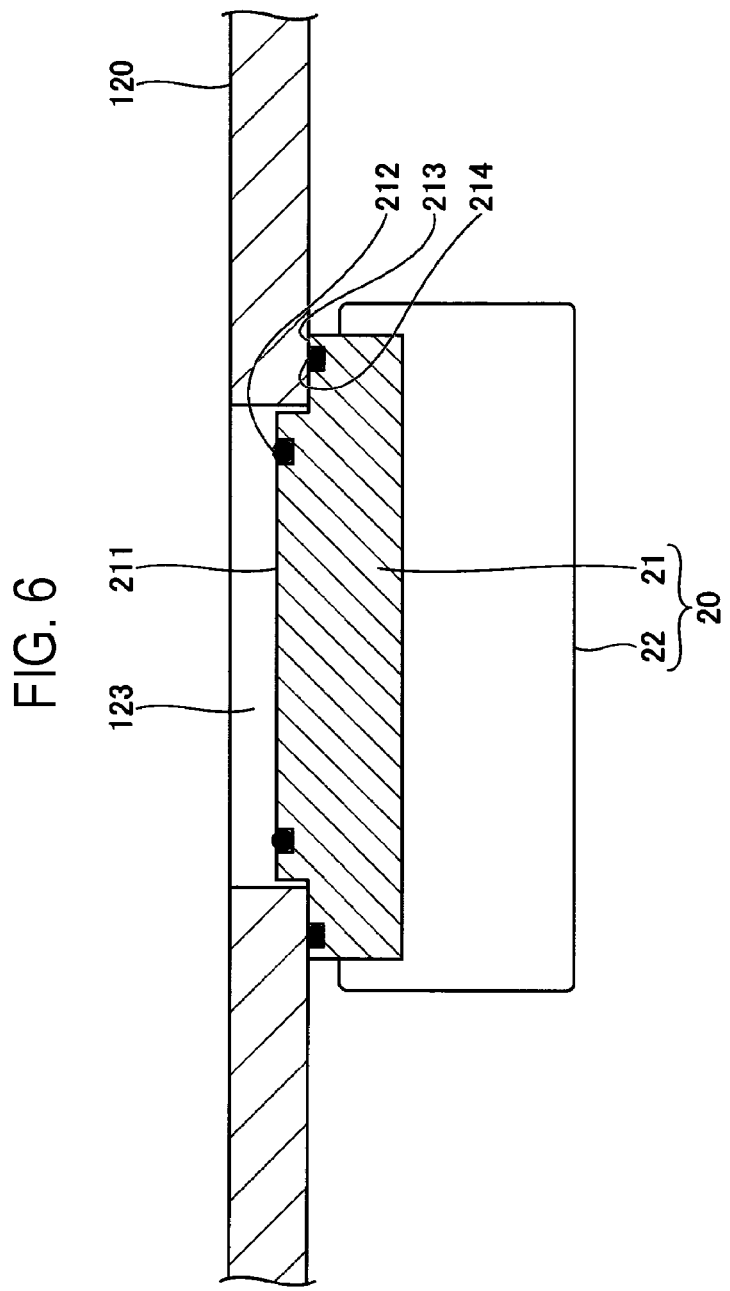

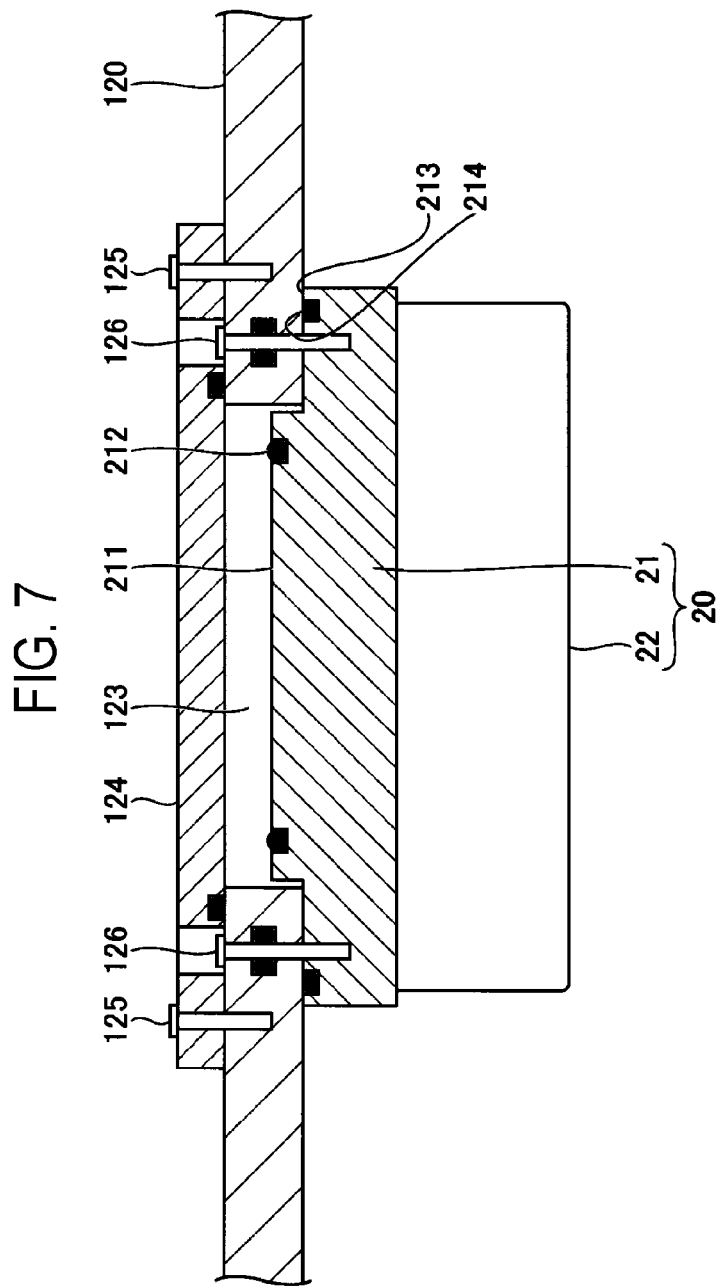

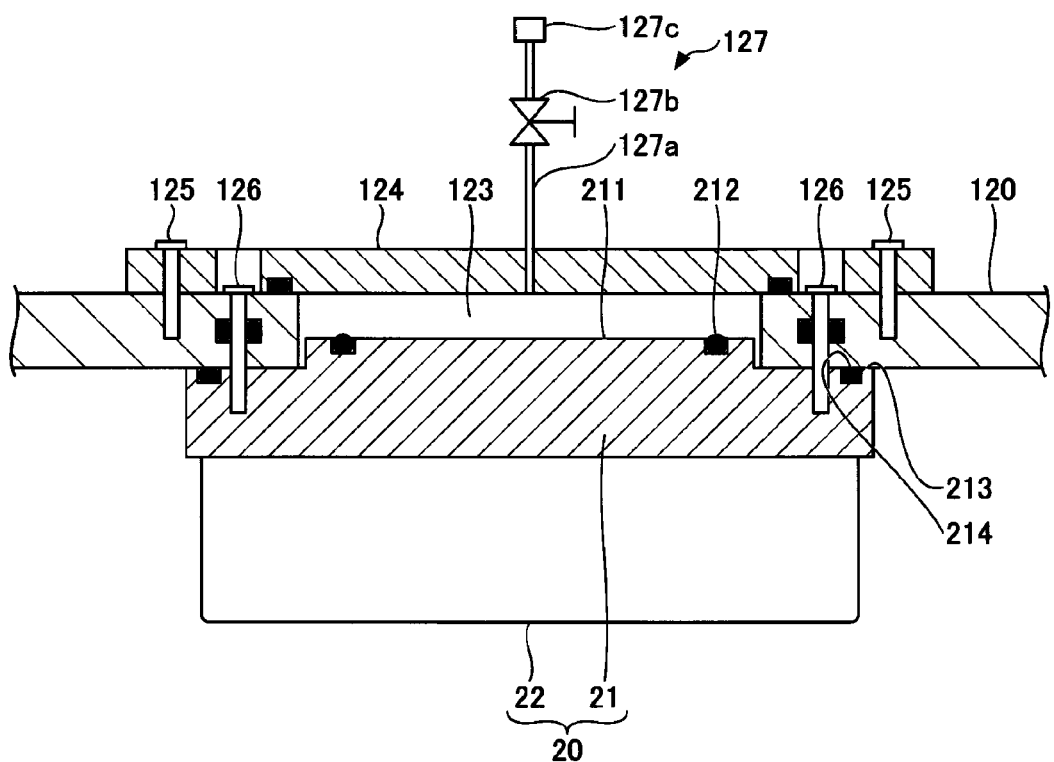

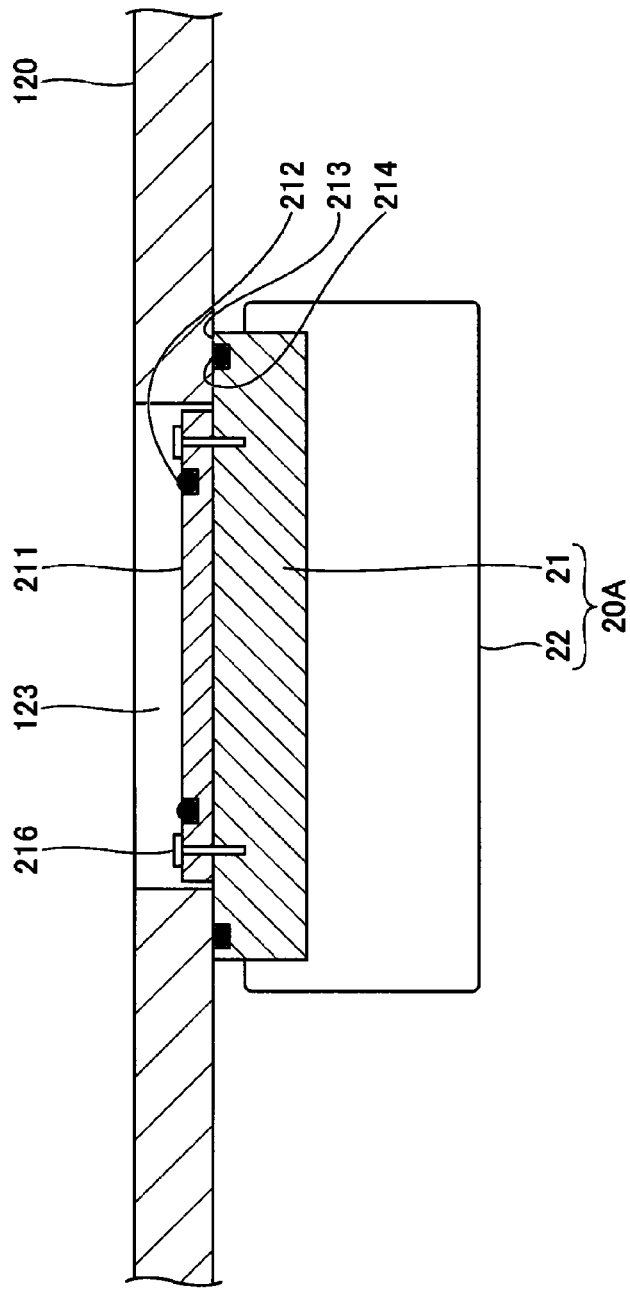

OPENING/CLOSING APPARATUS AND TRANSPORT CHAMBER

CROSS-REFERENCE TO RELATED APPLICATION

This application is based upon and claims the benefit of priority from Japanese Patent Application No. 2021-043858, filed on Mar. 17, 2021, the entire contents of which are incorporated herein by reference.

TECHNICAL FIELD

The present disclosure relates to an opening/closing apparatus and a transport chamber.

BACKGROUND

A transport chamber including an opening/closing apparatus which can perform opening/closing functions between a processing chamber and the transport chamber is known.

Patent Document 1 discloses a semiconductor processing facility which transports a substrate using a planar motor.

PRIOR ART DOCUMENT

Patent Document

Japanese Laid-Open Patent Publication No. 2018-504784

SUMMARY

According to embodiments of the present disclosure, there is provided an opening/closing apparatus for opening/closing an opening which allows a first chamber and a second chamber adjacent to the first chamber to communicate with each other, includes a planar motor including coils arranged in the first chamber, a moving body including a valve body configured to move on the planar motor and close the opening, and a controller configured to control energization of the coils.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a horizontal cross-sectional view illustrating an example of the opening/closing apparatus when the opening is closed.

FIG. 6 is a horizontal cross-sectional view illustrating an example of the opening/closing apparatus when maintenance of a seal member is performed.

FIG. 7 is a horizontal cross-sectional view illustrating another example of the opening/closing apparatus when the maintenance of the seal member is performed.

FIG. 8A is a horizontal cross-sectional view illustrating still another example of the opening/closing apparatus when the maintenance of the seal member is performed.

FIG. 9 is a horizontal cross-sectional view illustrating an example of an opening/closing apparatus including another moving body when maintenance of a seal member is performed.

DETAILED DESCRIPTION

Figure 1:
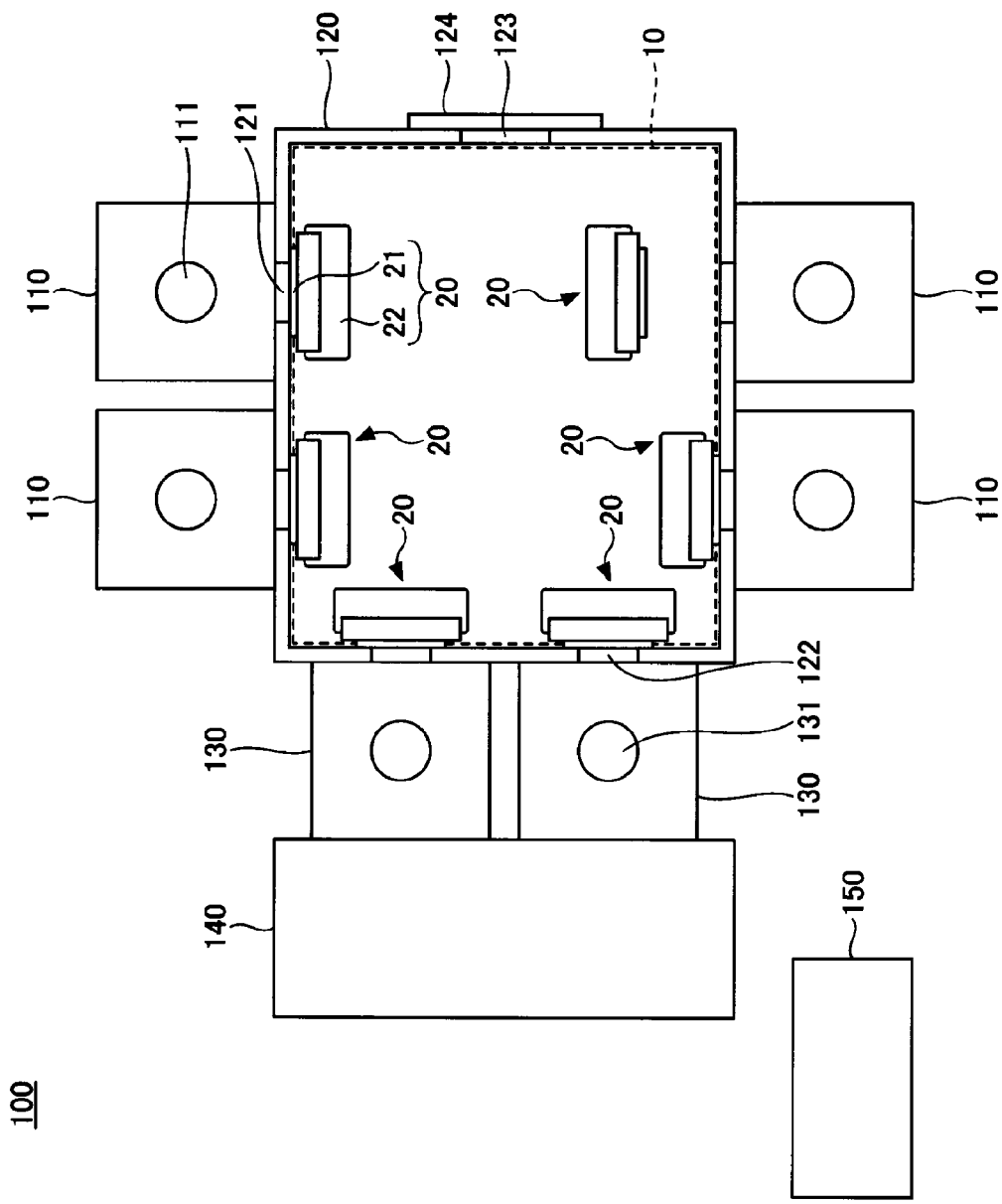
FIG. 1 is a plan view illustrating a configuration of an example of a substrate processing system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions thereof may be omitted.

<Substrate Processing System 100>

First, an example of an overall configuration of a substrate processing system 100 according to an embodiment will be described with reference to FIG. 1. FIG. 1 is a plan view illustrating a configuration of an example of the substrate processing system 100 according to an embodiment.

The substrate processing system 100 illustrated in FIG. 1 is a system having a cluster structure (a multi-chamber type). The substrate processing system 100 includes a plurality of processing chambers 110, a vacuum transport chamber 120, a load-lock chamber 130, an atmospheric transport chamber 140, and a controller 150.

The processing chambers 110 are depressurized to a predetermined vacuum atmosphere, and inside the vacuum processing chambers, a desired process (e.g., an etching process, a film forming process, a cleaning process, or an ashing process) is performed on a semiconductor wafer W (hereinafter, also referred to as a "wafer W"). The processing chambers 110 are disposed adjacent to the vacuum transport chamber 120. Each processing chamber 110 has a stage 111 on which a wafer W is placed. The operation of each part for processing in each processing chamber 110 is controlled by the controller 150.

The vacuum transport chamber 120 is depressurized to a predetermined vacuum atmosphere. The vacuum transport chamber 120 includes openings 121 which allow the processing chambers 110 and the vacuum transport chamber 120 to communicate with each other. The vacuum transport chamber 120 includes openings 122 which allow the load-lock chambers 130 and the vacuum transport chamber 120 to communicate with each other. The vacuum transport chamber 120 also includes an opening/closing apparatus (a planar motor 10 and moving bodies 20) which opens/closes the openings 121 and 122. The opening/closing apparatus will be described later with reference to FIG. 2 and the like.

The vacuum transport chamber 120 includes an opening 123 which communicates with the exterior. The opening 123 is openable and closed by a closing member 124.

In addition, inside the vacuum transport chamber 120, a substrate transport apparatus (not illustrated) configured to transport a wafer W is provided. The substrate transport apparatus performs carry-in/out of a wafer W between the processing chambers 110 and the vacuum transport chamber 120 via the openings 121. In addition, the substrate transport apparatus performs carry-in/out of a wafer W between the load-lock chambers 130 and the vacuum transport chamber 120 via the openings 122. The substrate transport apparatus is controlled by the controller 150.

The load-lock chambers 130 are provided between the vacuum transport chamber 120 and the atmospheric transport chamber 140. Each load-lock chamber 130 includes a stage 131 on which a wafer W is placed. The load-lock chambers 130 are configured to switch between an air atmosphere and a vacuum atmosphere. The load-lock chambers 130 and the vacuum transport chamber 120 having a vacuum atmosphere communicate with each other through the openings 122 which are openable/closable by the opening/closing apparatus. The load-lock chambers 130 and the atmospheric transport chamber 140 having an air atmosphere communicate with each other through openings (not illustrated) which are openable and closable by an opening/closing apparatus (not illustrated). Switching between the vacuum atmosphere and the air atmosphere in the load-lock chambers 130 is controlled by the controller 150.

The atmospheric transport chamber 140 is in the air atmosphere, and, for example, downflow of clean air is formed therein. Inside the atmospheric transport chamber 140, a transport apparatus (not illustrated) for transporting a wafer W is provided. The transport apparatus (not illustrated) performs carry-in/out of a wafer W between the load-lock chambers 130 and the atmospheric transport chamber 140. The operation of the transport apparatus (not illustrated) is controlled by the controller 150.

A load port (not illustrated) is provided on a wall surface of the atmospheric transport chamber 140. A carrier (not illustrated) containing wafers W or an empty carrier is installed in the load port. As the carrier, for example, a front opening unified pod (FOUP) or the like may be used.

The transport apparatus (not illustrated) of the atmospheric transport chamber 140 may take out the wafer W accommodated in the carrier installed in the load port and place the wafer W on the stage 131 of a load-lock chamber 130. In addition, the transport apparatus (not illustrated) of the atmospheric transport chamber 140 may take out the wafer W placed on the stage 131 of the load-lock chamber 130 to accommodate the wafer W in the carrier installed in the load port.

The controller 150 includes a central processing unit (CPU), a read only memory (ROM), a random access memory (RAM), and a hard disk drive (HDD). The controller 150 may have another storage area such as a solid state drive (SSD) without being limited to the HDD. A recipe in which a process procedure, process conditions, and transport conditions are set is stored in a non-transitory computer-readable storage medium such as the HDD or the RAM.

The CPU controls the processing of a wafer W in each processing chamber 110 according to the recipe, and controls the transport of the wafer W. The HDD or RAM may store a program for executing the processing of the wafer W or the transport of the wafer W in each processing chamber 110. The program may be provided in the state of being stored in a non-transitory computer-readable storage medium, or may be provided from an external device via a network.

Figure 2:
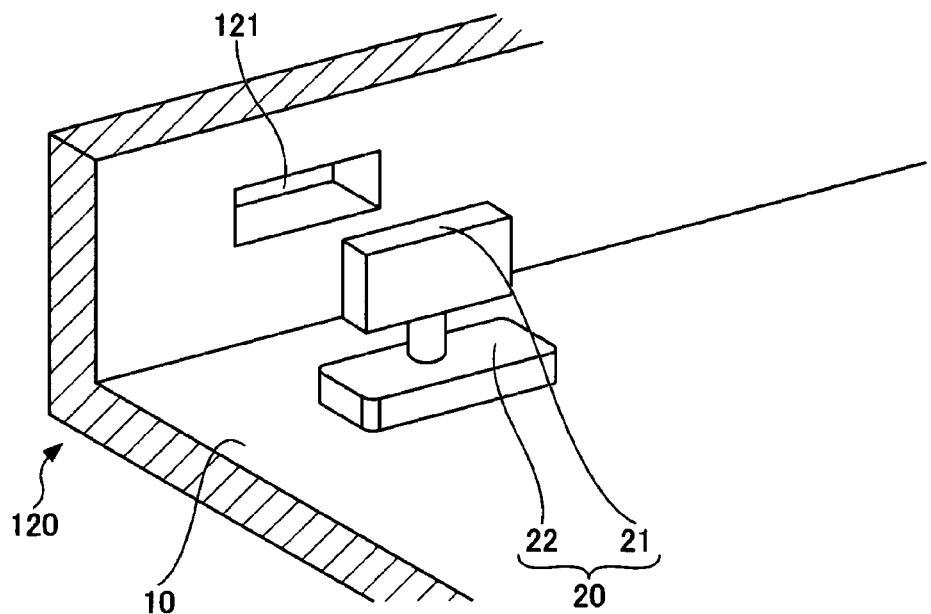
FIG. 2 is a perspective view illustrating an example of an opening and an opening/closing apparatus.
Figure 3:
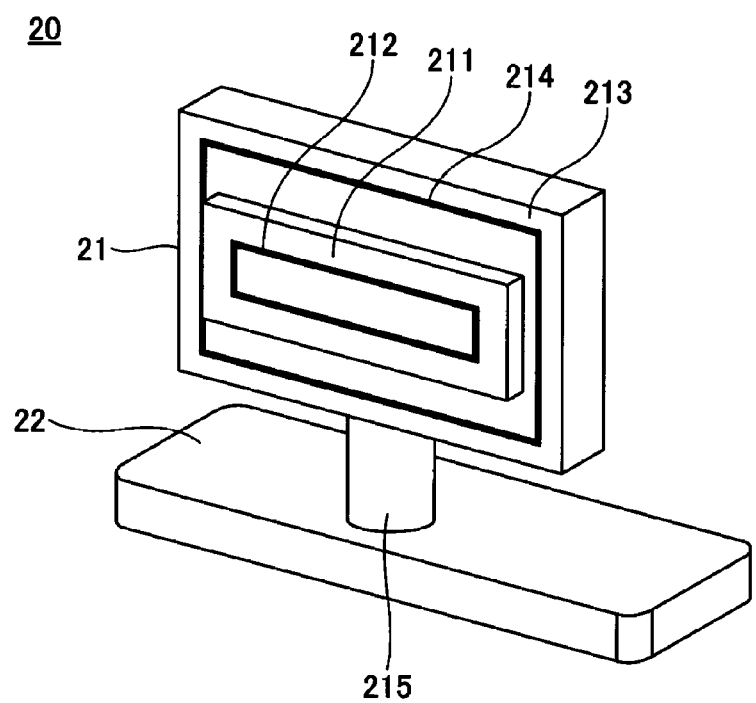
FIG. 3 is a perspective view illustrating an example of the opening/closing apparatus.

Next, an opening/closing apparatus which opens/closes the openings 121 and 122 will be described with reference to FIGS. 2 to 5. FIG. 2 is a perspective view illustrating an example of the opening 121 and the opening/closing apparatus. FIG. 3 is a perspective view illustrating an example of a moving body 20 of the opening/closing apparatus.

The opening/closing apparatus includes a planar motor 10 and a moving body 20.

The planar motor 10 is disposed on a floor surface of the vacuum transport chamber 120.

The moving body 20 includes a valve body 21 and a base 22. The valve body 21 includes a valve plate 211, a seal member 212, an enlarged portion 213, a seal member 214, and a support 215. The valve plate 211 is formed to protrude from the enlarged portion 213. The valve plate 211 is a member which closes the openings 121 and 122, and is formed to be larger than the openings 121 and 122 and smaller than the opening 123. The valve plate 211 is provided with a seal member 212 which seals the opening 121 or 122 when the valve plate 211 closes the opening 121 or 122. The enlarged portion 213 is a member which closes the opening 123, and is formed to be larger than the opening 123. The enlarged portion 213 is provided with a seal member 214 which seals the opening 123 when the enlarged portion 213 closes the opening 123. The support 215 connects the enlarged portion 213 and the base 22 to each other.

Figure 4:
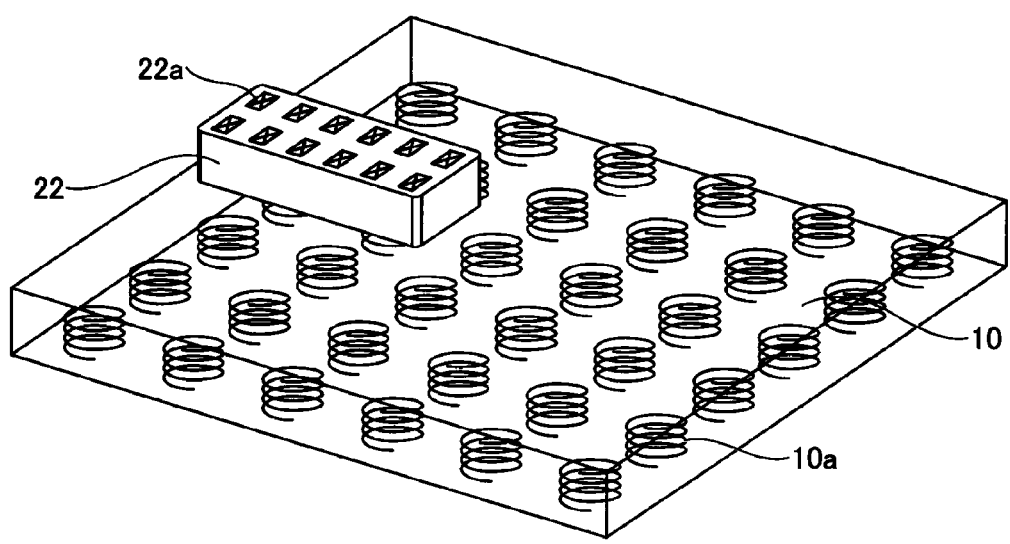
FIG. 4 is a perspective view illustrating the driving principle of the opening/closing apparatus.

The planar motor 10 and the base 22 of the moving body 20 will be further described with reference to FIG. 4. FIG. 4 is a perspective view illustrating driving principle of the opening/closing apparatus.

In the planar motor 10, a plurality of coils 10a is arranged. The coils 10a generate magnetic fields by being supplied with a current. The controller 150 (see FIG. 1) is configured to be able to individually control the current value of energizing each coil 10a.

A plurality of permanent magnets 22a is arranged in the base 22. By the magnetic fields generated by the coils 10a, the base 22 magnetically floats on the planar motor 10. In addition, the base 22 moves on the planar motor 10 due to the magnetic fields generated by the coils 10a.

With such a configuration, the controller 150 (see FIG. 1) is configured to be capable of controlling the position, orientation, and floating amount of the base 22 by controlling the current value of each coil 10a of the planar motor 10.

The controller 150 may move and/or turn the moving body 20 in the vacuum transport chamber 120 by controlling the energization of each coil 10a of the planar motor 10 so that the base 22 is positioned at a desired position. In other words, the controller 150 may open/close the opening 121 or 122 using the valve body 21 by moving the moving body 20 on the planar motor 10.

FIG. 5 is a horizontal cross-sectional view illustrating an example of the opening/closing apparatus when the opening 121 is closed.

The controller 150 may cause the valve plate 211 to close the opening 121 by moving the moving body 20 to bring the valve plate 211 of the valve body 21 into contact with the inner wall surface of the vacuum transport chamber 120. In addition, the inner wall surface of the vacuum transport chamber 120 and the valve plate 211 are sealed by the seal member 212, and the processing chamber 110 is sealed.

The opening 121 may be opened by moving the moving body 20 from the position (see FIG. 5) of closing the opening 121 (see FIG. 1). This makes it possible to reduce the area occupied by the substrate processing system 100 compared with a configuration in which an opening/closing apparatus which opens/closes an opening by mechanical drive, such as a gate valve (not illustrated), is provided between the processing chamber 110 and the vacuum transport chamber 120.

As described above, the opening/closing apparatus of the present embodiment is capable of opening/closing the opening 121. Similarly, the opening/closing apparatus is capable of opening and closing the opening 122.

There may be provided a mechanism (not illustrated) which assists the contact force between the valve plate 211 and the inner wall surface of the vacuum transport chamber 120 when the opening 121 or 122 is closed by bringing the valve plate 211 of the valve body 21 into contact with the inner wall surface of the vacuum transport chamber 120. For example, there may be provided a lock mechanism which fixes the valve body 21 to the inner wall surface of the vacuum transport chamber 120 when the valve body 21 is brought into contact with the inner wall surface of the vacuum transport chamber 120. This makes it possible to reliably close the opening 121.

Further, the valve body 21 may have a magnet (not illustrated) which is attracted to the wall surface of the vacuum transport chamber 120. This makes it possible to cause the valve body 21 to be attracted to the wall surface of the vacuum transport chamber 120 by the magnet (not illustrated) when the opening 121 or 122 is closed by the valve body 21.

FIG. 6 is a horizontal cross-sectional view illustrating an example of the opening/closing apparatus when maintenance of a seal member 212 is performed. For example, the sealing property of the seal member 212 is deteriorated due to exposure to a processing gas of the processing chamber 110 or the like. When the sealing property of the seal member 212 is deteriorated, maintenance (replacement, cleaning, etc.) of the seal member 212 is performed.

When the maintenance of the seal member 212 is performed, the controller 150 may cause the enlarged portion 213 to close the opening 123 from the interior of the vacuum transport chamber 120 by moving the moving body 20 to bring the enlarged portion 213 of the valve body 21 into contact with the inner wall surface of the vacuum transport chamber 120. In addition, the inner wall surface of the vacuum transport chamber 120 and the enlarged portion 213 are sealed by the seal member 214, and the vacuum transport chamber 120 is hermetically sealed. At this time, the valve plate 211 is inserted into the opening 123.

Then, by removing the closing member 124 (see FIG. 1) from the outer wall surface of the vacuum transport chamber 120, it is possible to perform maintenance (replacement, cleaning, or the like) on the seal member 212 from the exterior of the vacuum transport chamber 120 while keeping the vacuum transport chamber 120 in the vacuum atmosphere.

As described above, according to the opening/closing apparatus of the present embodiment, it is possible to perform the maintenance of the seal member 214 while keeping the vacuum atmosphere of the vacuum transport chamber 120. This makes it possible to reduce the work time of maintenance work.

In addition to the moving body 20 which opens/closes each opening 121 or 122, a replacement moving body 20 may be disposed inside the vacuum transport chamber 120. This makes it possible to ensure the sealing property by replacing the moving body 20 which opens and closes each opening 121 or 122 with the replacement moving body 20. Since it is possible to open/close the opening 121 or 122 using the replacement moving body 20 when the maintenance of the seal member 212 of one moving body 20 is performed, the maintenance of the seal member 212 can be performed without stopping the substrate processing system 100.

The substrate processing system 100 may be provided with an apparatus for opening/closing the closing member 124 and performing the maintenance of the seal member 214. This makes it possible to automate the maintenance of the seal member 214.

FIG. 7 is a horizontal cross-sectional view illustrating another example of the opening/closing apparatus when the maintenance of the seal member 212 is performed.

A first set of fixing devices 125 and a second set of fixing devices 126 may be provided on the wall surface of the vacuum transport chamber 120. The first set of fixing devices 125 detachably fix the closing member 124 to the outer wall surface of the vacuum transport chamber 120. The second set of fixing devices 126 detachably fix the valve body 21 to the inner wall surface of the vacuum transport chamber 120. In the example of FIG. 7, the fixing devices 125 and 126 are illustrated as removable bolts.

When the maintenance of the seal member 212 is performed, the controller 150 causes the enlarged portion 213 to close the opening 123 from the interior of the vacuum transport chamber 120 by moving the moving body 20 to bring the enlarged portion 213 of the valve body 21 into contact with the inner wall surface of the vacuum transport chamber 120. Next, the valve body 21 is fixed to the inner wall surface of the vacuum transport chamber 120 using the second set of fixing devices 126. Next, the first set of fixing devices 125 are released, the closing member 124 is moved, the opening 123 is opened from the exterior of the vacuum transport chamber 120, and the maintenance of the seal member 212 is performed. This makes it possible to prevent the valve body 21 from being displaced due to a pressure difference between the interior of the vacuum transport chamber 120 which is in a vacuum atmosphere and the exterior of the vacuum transport chamber 120 which is in an air atmosphere, so that the vacuum transport chamber 120 can be kept in a hermetically sealed state.

Although the first and second set of fixing devices 125 and 126 are illustrated in FIG. 7 as bolts, the first and second set of fixing devices 125 and 126 are not limited thereto. Fixing devices such as lock pins may be used.

Figure 8B:
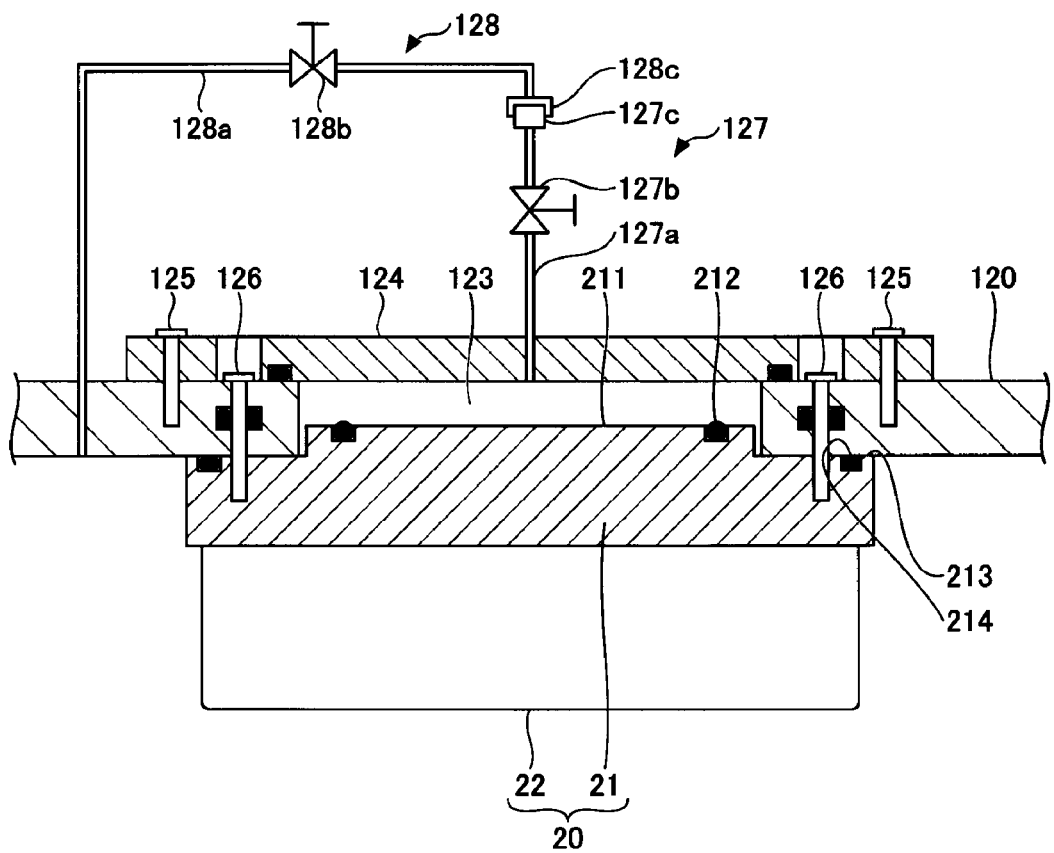
FIG. 8B is a horizontal cross-sectional view illustrating still another example of the opening/closing apparatus when the maintenance of the seal member is performed.
Figure 8C:
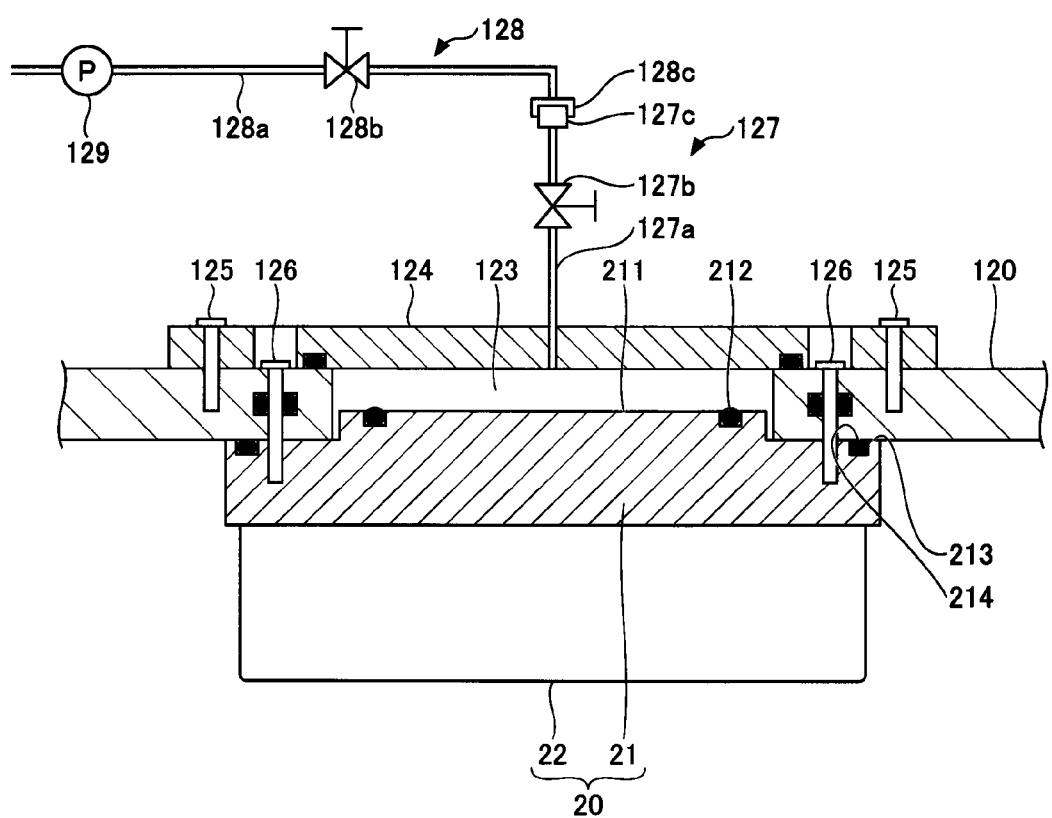
FIG. 8C is a horizontal cross-sectional view illustrating yet another example of the opening/closing apparatus when the maintenance of the seal member is performed.

FIGS. 8A to 8C are horizontal cross-sectional views illustrating other examples of the opening/closing apparatuses when the maintenance of the seal member 212 is performed.

As illustrated in FIG. 8A, the closing member 124 may be provided with a vent device 127. The vent device 127 includes a vent line 127a, a valve 127b, and a connecting portion 127c. The vent line 127a is formed such that gas can flow therethrough. One end of the vent line 127a is connected to the space of the opening 123 (the space between the closing member 124 and the valve plate 211). In addition, the vent line 127a is provided with an openable/closable valve 127b. The valve 127b is normally closed. At the other end of the vent line 127a, a connecting portion 127c which is connectable to the connecting portion 128c to be described later is provided.

Here, when maintenance of the seal member 212 is performed, the controller 150 causes the enlarged portion 213 to close the opening 123 from the interior of the vacuum transport chamber 120 by moving the moving body 20 to bring the enlarged portion 213 of the valve body 21 into contact with the inner wall surface of the vacuum transport chamber 120. Next, the valve body 21 is fixed to the inner wall surface of the vacuum transport chamber 120 using the second set of fixing devices 126. Here, the space of the opening 123 is in a vacuum atmosphere. Next, the valve 127b is opened, and the space of the opening 123 and the exterior of the vacuum transport chamber 120 which is an atmospheric atmosphere communicate with each other via the vent line 127a. Next, the first set of fixing devices 125 are released, the closing member 124 is moved, the opening 123 is opened from the exterior of the vacuum transport chamber 120, and the maintenance of the seal member 212 is performed. This makes it possible to reduce the pressure difference between the space of the opening 123 and the exterior of the vacuum transport chamber 120 so that the closing member 124 can be easily removed from the outer wall surface of the vacuum transport chamber 120.

As illustrated in FIG. 8B, an evacuation device 128 may be provided on the outer wall surface of the vacuum transport chamber 120. The evacuation device 128 includes an evacuation line 128a, a valve 128b, and a connecting portion 128c. The evacuation line 128a is formed such that gas can flow therethrough. One end of the evacuation line 128a is connected to the interior of the vacuum transport chamber 120. In addition, the evacuation line 128a is provided with an openable/closable valve 128b. The valve 128b is normally closed. At the other end of the evacuation line 128a, a connecting portion 128c which is connectable to the connecting portion 127c is provided. At least a portion of the evacuation line 128a is formed of a flexible pipe or the like, and the connecting portion 127c and the connecting portion 128c are configured to be detachable from each other.

Here, after the maintenance of the seal member 212 is performed, the opening 123 is closed by the closing member 124 from the exterior of the vacuum transport chamber 120 by installing the closing member 124 on the outer wall surface of the vacuum transport chamber 120. Next, the closing member 124 is fixed to the outer wall surface of the vacuum transport chamber 120 using the first set of fixing devices 125. Here, the space of the opening 123 is in an atmospheric atmosphere. Next, the connecting portion 127c and the connecting portion 128c are connected to each other, the valve 127b and the valve 128b are opened, and the space of the opening 123 and the interior of the vacuum transport chamber 120 which is in the vacuum atmosphere communicate with each other via the vent line 127a and the evacuation line 128a. As a result, the space of the opening 123 is gradually depressurized by a vacuum pump (not illustrated) of the vacuum transport chamber 120 to bring the space of the opening 123 closer to the vacuum atmosphere. After depressurizing the space of the opening 123, the valve 127b and the valve 128b may be closed to release the connection of the connecting portion 127c and the connecting portion 128c. Next, the second set of fixing devices 126 are released. Next, the controller 150 causes the valve body 21 to be spaced apart from the opening 123 by moving the moving body 20. This makes it possible to prevent the degree of vacuum inside the vacuum transport chamber 120 from being significantly reduced when the valve body 21 is spaced apart from the opening 123.

As illustrated in FIG. 8C, the evacuation line 128a may be connected to the vacuum pump 129. This makes it possible to depressurize the space of the opening 123 to a vacuum atmosphere by the vacuum pump 129.

FIG. 9 is a horizontal cross-sectional view illustrating an example of an opening/closing apparatus including another moving body 20A when maintenance of a seal member 212 is performed. In the moving body 20A illustrated in FIG. 9, a valve plate 211 provided with the seal member 212 is provided to be detachable relative to the enlarged portion 213 provided with a seal member 214, and the valve plate 211 is fixed to the enlarged portion 213 by a third set of fixing devices 216. In the example of FIG. 9, the third set of fixing devices 216 are illustrated as detachable bolts, but the present disclosure is not limited to this. Fixing devices such as lock pins may be used. As a result, the opening 123 is closed from the interior of the vacuum transport chamber 120 by the enlarged portion 213 provided with the seal member 214. In addition, when maintenance of the seal member 212 is performed, the third set of fixing devices 216 are removed, and the seal member 212 is replaced by the replacement of the valve plate 211. This makes it possible to improve the workability of maintenance work.

In the foregoing, an opening/closing apparatus according to an embodiment has been described, but the present disclosure is not limited to the above-described embodiment or the like, and can be variously modified and improved within the scope of the gist of the present disclosure described in the claims.

The planar motor 10 has been described as being provided on the floor surface of the vacuum transport chamber 120, but the present disclosure is not limited thereto. For example, the planar motor 10 may be provided on the ceiling surface of the vacuum transport chamber 120, and a moving body 20 may move on the ceiling surface of the vacuum transport chamber 120 by the magnetic force of the planar motor 10. The moving body 20 is magnetically attracted by the planar motor 10 provided on the ceiling surface of the vacuum transport chamber 120, and floats with a space between the moving body 20 and the ceiling surface of the vacuum transport chamber 120. This makes it possible to dispose a substrate transport apparatus, for example, on a bottom surface of the vacuum transport chamber 120.

Figure 10:
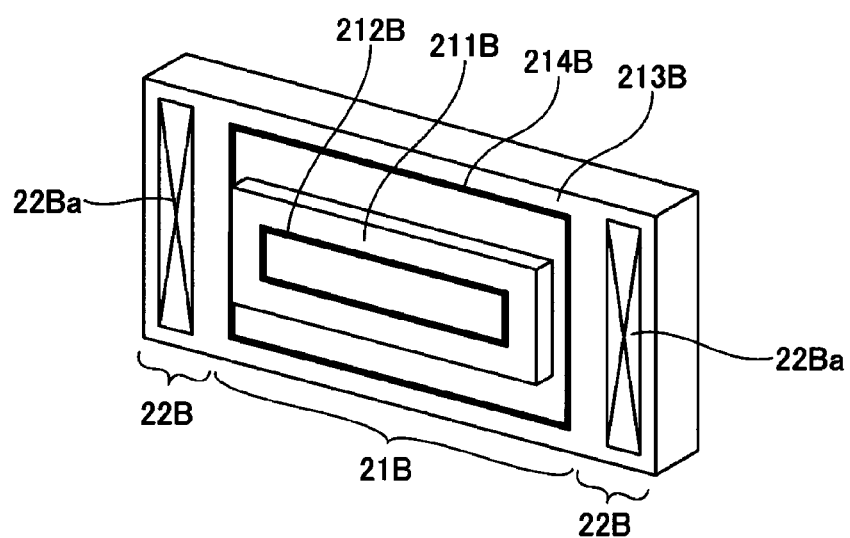
FIG. 10 is a perspective view illustrating an example of a moving body moving on an inner wall surface.
Figure 11:
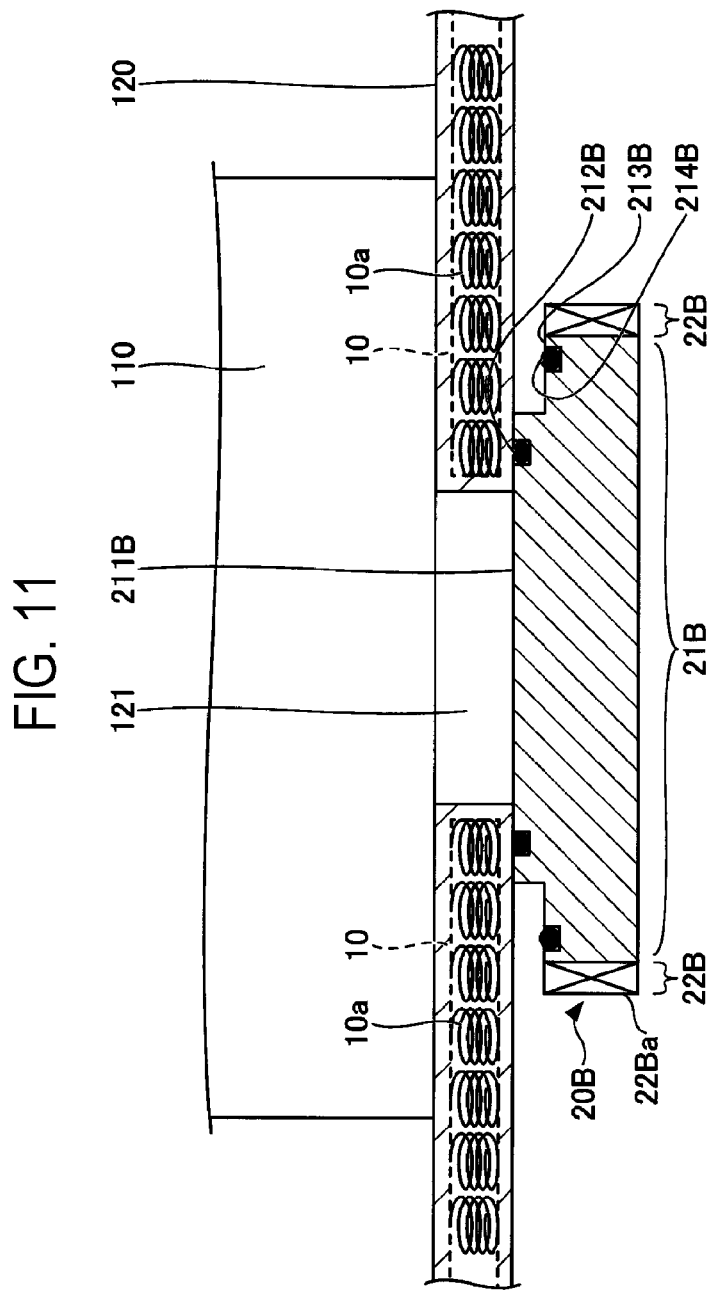
FIG. 11 is a horizontal cross-sectional view illustrating an example of an opening/closing apparatus when an opening is closed, in the opening/closing apparatus which includes a moving body which moves on an inner wall surface.

In addition, the planar motor 10 may be provided on an inner wall surface of the vacuum transport chamber 120, and a moving body 20B may move on the inner wall surface of the vacuum transport chamber 120 by the magnetic force of the planar motor 10. FIG. 10 is a perspective view illustrating an example of a moving body 20B moving on an inner wall surface. FIG. 11 is a horizontal cross-sectional view illustrating an example of an opening/closing apparatus including a moving body 20B moving on an inner wall surface when an opening 121 is closed.

The opening/closing apparatus includes a planar motor 10 and a moving body 20B.

As illustrated in FIG. 11, the planar motor 10 is disposed in the wall of the vacuum transport chamber 120 in which the opening 121 is formed. In the planar motor 10, a plurality of coils 10a is arranged. The coils 10a generate magnetic fields by being supplied with a current. The controller 150 (see FIG. 1) is configured to be able to individually control the current value of energizing each coil 10*a*.

As illustrated in FIG. 10, the moving body 20B includes a valve body portion 21B and base portions 22B. That is, in the moving body 20B, the valve body portion 21B which closes the opening 121 or 122 and the base portions 22B which move on the planar motor 10 are integrally formed.

The valve body portion 21B includes a valve plate 211B, a seal member 212B, an enlarged portion 213B, and a seal member 214B. The valve plate 211B is formed to protrude from the enlarged portion 213B. The valve plate 211B is a member which closes the opening 121 or 122, and is formed to be larger than the opening 121 or 122 and smaller than the opening 123. The valve plate 211B is provided with a seal member 212B which seals the opening 121 or 122 when the valve plate 211B closes the opening 121 or 122. The enlarged portion 213B is a member which closes the opening 123, and is formed to be larger than the opening 123. The enlarged portion 213B is provided with a seal member 214B which seals the opening 123 when the enlarged portion 213B closes the opening 123.

A plurality of permanent magnets 22B a is arranged in the base portions 22B. In the moving body 20B illustrated in FIG. 10, it is illustrated that the base portions 22B are provided at opposite sides of the moving body 20B in the longitudinal direction with the enlarged portion 213B of the valve body portion 21B interposed therebetween when viewed in a direction perpendicular to a contact surface of the valve plate 211B, but the present disclosure is not limited thereto. For example, the plurality of permanent magnets 22Ba may be arranged on the entire surface of the enlarged portions 213B to form the base portions 22B.

The base portions 22B magnetically float on the planar motor 10 due to the magnetic fields generated by the coils 10*a*. In addition, the base portions 22B move on the planar motor 10 due to the magnetic fields generated by the coils 10*a*.

With such a configuration, the controller 150 (see FIG. 1) is configured to be capable of controlling the position, orientation, and floating amount of the moving body 20B (the base portions 22B) by controlling the current value of each coil 10*a* of the planar motor 10. That is, by controlling the position and orientation of the moving body 20B (the base portions 22B), the moving body 20B can be moved and/or turned on the inner wall surface of the vacuum transport chamber 120. In addition, by controlling the floating amount of the moving body 20B (the base portions 22B), it is possible to control the opening/closing of the opening 121 or 122 by the moving body 20B (the valve body portion 21B).

In addition, the opening/closing apparatus which opens/closes the openings 121 between the processing chambers 110 and the vacuum transport chamber 120 and the openings 122 between the vacuum transport chamber 120 and the load-lock chambers 130 has been described as an example, but the present disclosure is not limited thereto. For example, the present disclosure may be applied to an opening/closing apparatus (a planar motor 10 and moving bodies 20) which opens/closes openings (not illustrated) which communicate the load-lock chambers 130 and the atmosphere transport chamber 140 with each other. In addition, the planar motor 10 may be provided on at least one of the ceiling surface, the side surface, and the bottom surface of the atmospheric transport chamber 140. Further, since the moving bodies 20 are disposed in the atmospheric transport chamber 140 side, it is easy to replace the seal members 212 of the moving bodies 20.

Figure 12:
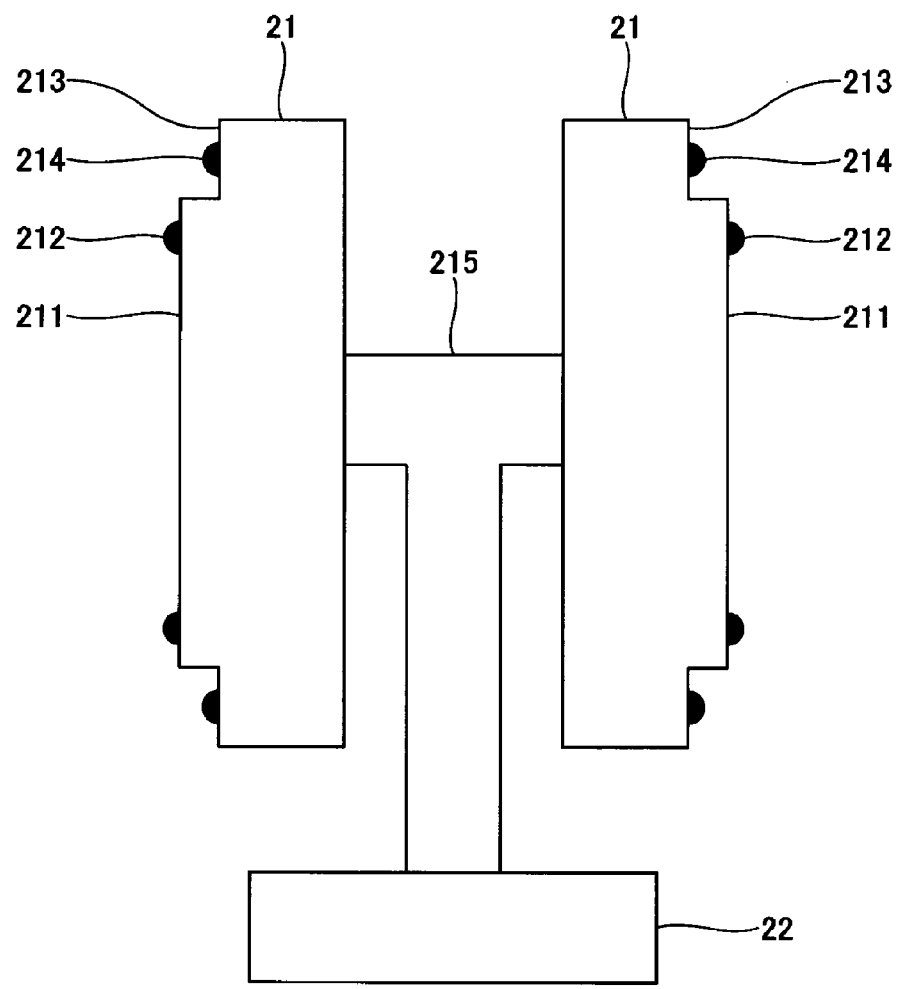
FIG. 12 is a side view illustrating an example of a moving body including a plurality of valve bodies.

In addition, as illustrated in FIG. 3, it has been illustrated that one moving body 20 includes one valve body 21 (a valve plate 211 and a seal member 212), but the present disclosure is not limited thereto. FIG. 12 is a side view illustrating an example of a moving body 20C including a plurality of valve bodies 21. The moving body 20C includes a plurality of (two) valve bodies 21 and one base 22. As a result, the maintenance frequency of seal members 212 can be reduced by switching the valve bodies 21 which open/close the openings 121 and 122.

According to an aspect, it is possible to provide an opening/closing apparatus which opens/closes an opening, and a transport chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An opening/closing apparatus for opening/closing an opening which allows a first chamber and a second chamber adjacent to the first chamber to communicate with each other, the opening/closing apparatus comprising:
   a planar motor including coils arranged in the first chamber;
   a moving body configured to move on the planar motor, including a base that moves on the planar motor with no guiding structure by a magnetic force between the planar motor and the base, and including a valve body configured to open or close the opening by movements of the base by the magnetic force between the planar motor and the base; and
   a controller configured to control energization of the coils.

2. The opening/closing apparatus of claim 1, wherein the valve body includes a valve plate provided with a first seal member and configured to close the opening.

3. The opening/closing apparatus of claim 2, wherein the valve body further includes an enlarged portion provided with a second seal member and having a size larger than the valve plate.

4. A transport chamber comprising:
   a first opening communicating with an adjacent chamber;
   a planar motor including arranged coils;
   a moving body configured to move on the planar motor, including a base that moves on the planar motor with no guiding structure by a magnetic force between the planar motor and the base, and including a valve body configured to open or close the first opening by movements of the base by the magnetic force between the planar motor and the base; and
   a controller configured to control energization of the coils.

5. The transport chamber of claim 4, wherein the valve body includes a valve plate provided with a first seal member and configured to close the first opening.

6. The transport chamber of claim 5, further comprising:
   a second opening communicating with an exterior of the transport chamber; and
   a closing member configured to close the second opening, wherein the valve body includes an enlarged portion provided with a second seal member and configured to close the second opening.

7. The transport chamber of claim 6, wherein, when closing the second opening with the enlarged portion, the valve plate is inserted into the second opening.

8. The transport chamber of claim 6, further comprising:
a fixing device configured to fix the valve body when the second opening is closed by the enlarged portion.

9. The transport chamber of claim 7, further comprising:
a fixing device configured to fix the valve body when the second opening is closed by the enlarged portion.

* * * * *